(12) United States Patent
Banzhof (10) Patent No.: US 8,294,096 B2
(45) Date of Patent: Oct. 23, 2012

(54) CHARGED PARTICLE BEAM DEVICE AND A METHOD OF OPERATING A CHARGED PARTICLE BEAM DEVICE

(75) Inventor: Helmut Banzhof, Poing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 13/089,059

(22) Filed: Apr. 18, 2011

(65) Prior Publication Data

US 2011/0253893 A1    Oct. 20, 2011

(30) Foreign Application Priority Data

Apr. 19, 2010  (EP) .................................. 10160340

(51) Int. Cl.
*G21K 1/08* (2006.01)
*G01N 23/00* (2006.01)

(52) U.S. Cl. ......... 250/310; 250/307; 250/306; 250/309
(58) Field of Classification Search .................. 250/307, 250/310, 306, 311, 397; 850/9
See application file for complete search history.

(56) References Cited

U.S. PATENT DOCUMENTS

| 6,943,349 | B2 * | 9/2005 | Adamec et al. ..................... 850/9 |
| 7,112,792 | B2 * | 9/2006 | Agemura et al. ............. 250/310 |
| 7,348,559 | B2 * | 3/2008 | Agemura et al. ............. 250/310 |
| 2004/0119022 | A1 | 6/2004 | Sato et al. |
| 2005/0253083 | A1 * | 11/2005 | Sato et al. ...................... 250/398 |
| 2005/0263702 | A1 * | 12/2005 | Agemura et al. ............. 250/310 |
| 2006/0049348 | A1 | 3/2006 | Petrov et al. |
| 2006/0284087 | A1 * | 12/2006 | Agemura et al. ............. 250/309 |
| 2007/0051888 | A1 | 3/2007 | Rosenberg et al. |

OTHER PUBLICATIONS

EESR, EP 10160340, Oct. 13, 2010.
Benjamin Bunday, et al., *Small Feature Accuracy Challenge for CD-SEM Metrology Physical Model Solution*, International SEMATECH Manufacturing Initiative (ISMI), Proc. of SPIE, vol. 6152, 61520S-16; XP-002601204.
Maki Tanaka, et al., *Influence of Focus Variation on Linewidth Measurements*, Metrology, Inspection, and Process Control for Microlithography XIX, pp. 144-155, vol. 5752, SPIE, Bellingham, WA, 2005, US; XP-002601205.

* cited by examiner

*Primary Examiner* — Nikita Wells
*Assistant Examiner* — Johnnie L Smith
(74) *Attorney, Agent, or Firm* — Patterson & Sheridan, LLP (57) ABSTRACT

A charged particle beam device is provided, including: a charged particle beam source adapted to generate a charged particle beam on an axis; an optical aberration correction device and an objective lens device, which define a corrected beam aperture angle adjusted to reduce diffraction; and a charged particle beam tilting device; wherein the optical aberration correction device and the objective lens device are adapted to provide the charged particle beam with a beam aperture angle smaller than the corrected beam aperture angle; and wherein the charged particle beam tilting device is adapted to provide a beam tilt angle which is equal or less than the corrected beam aperture angle. Further, a method of operating a charged particle beam device is provided.

16 Claims, 5 Drawing Sheets

CHARGED PARTICLE BEAM DEVICE AND A METHOD OF OPERATING A CHARGED PARTICLE BEAM DEVICE

FIELD OF THE INVENTION

The invention generally relates to a charged particle beam device and a method of operating a charged particle beam device, particularly for measuring a CD of a specimen.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

For instance in semiconductor manufacturing, the trend concerning a circuit pattern formed on a wafer is moving towards micro-fabrication. Hence, the process monitoring of the pattern formation is of increasing importance. For evaluating a very fine pattern having a Critical Dimension (CD) at a wafer surface, e.g. a pattern of a dimension in the order of several tens of nanometers, a Critical Dimension Scanning Electron Microscope (CD SEM) has been in use. With a focusing lens the CD SEM focuses an electron beam emitted from an electron gun onto the wafer and scans over the wafer surface two-dimensionally using a scanning coil. Secondary electrons generated by the electron beam at the wafer surface are captured by a secondary electron detector, and the signal thus obtained is recorded as an image. The amount of generated electrons varies depending on concaves and convexes on the surface of the wafer. Therefore, the SEM image can be used as an indication of the surface topography of the wafer. For instance, a sudden increase of the secondary electron signal seen at an edge portion of the wafer pattern allows for determining the position of the edge in the SEM image and for measurement of structural dimensions at the wafer surface. However, the apparent beam width (ABW) limits the use of a CD SEM system to line widths above about 10 nm.

SUMMARY

According to one embodiment, a charged particle beam device is provided, including: a charged particle beam source adapted to generate a charged particle beam on an axis; an optical aberration correction device and an objective lens device, which define a corrected beam aperture angle adjusted to reduce diffraction; and a charged particle beam tilting device; wherein the optical aberration correction device and the objective lens device are adapted to provide the charged particle beam with a beam aperture angle smaller than the corrected beam aperture angle; and wherein the charged particle beam tilting device is adapted to provide a beam tilt angle which is equal or less than the corrected beam aperture angle.

According to another embodiment, a method of operating a charged particle beam device includes: generating a charged particle beam device on an axis; correcting optical aberrations of the charged particle beam; focusing the charged particle beam onto a specimen; and defining a corrected beam aperture angle adjusted to reduce diffraction; wherein the charged particle beam is provided having a beam aperture angle smaller than the corrected beam aperture angle; and the charged particle beam is tilted by a beam tilt angle which is equal or less than the corrected beam aperture angle.

According to a further embodiment, a charged particle beam device according to above one embodiment is used in a method of probing and/or structuring of a specimen.

According to a yet further embodiment, a charged particle beam device according to above one embodiment is used in a method of measuring a CD of a specimen.

Further advantages, features, and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

It is contemplated that elements of one embodiment may be advantageously utilized in other embodiments without further recitation.

BRIEF DESCRIPTION OF THE DRAWINGS

So that the manner in which the above recited features of the present invention can be understood in detail, a more particular description of embodiments of the invention, briefly summarized above, may be had by reference to embodiments. The accompanying drawings relate to embodiments of the invention and are described in the following. Some of the above mentioned embodiments will be described in more detail in the following description of typical embodiments with reference to the following drawings in which.

DETAILED DESCRIPTION OF THE DRAWINGS

Reference will now be made in detail to the various embodiments, one or more examples of which are illustrated in the figures. Each example is provided by way of explanation, and is not meant as a limitation of the invention.

Without limiting the scope of protection, in the following description the charged particle beam device is described referring to electrons as corpuscles or charged particles. Further, the charged particle beam device or components thereof will exemplarily be referred to as a charged particle beam device including the detection of secondary electrons. Embodiments described herein can still be applied for apparatuses and components detecting corpuscles such as secondary and/or backscattered charged particles in the form of electrons or ions, photons, X-rays or other signals, in order to obtain a specimen image.

Generally, when referring to corpuscles it is to be understood as a light signal, in which the corpuscles are photons, as well as particles or charged particles, in which the corpuscles are ions, atoms, electrons or other particles. Further, in the following, the term "primary charged particles" refers to a charged particle beam directed towards a specimen for imaging and/or structuring. Moreover, the term "secondary charged particles" includes secondary charged particles created at or in the specimen, and backscattered charged particles. In case of a primary electron beam, the term "secondary electrons" includes secondary electrons (SE), e.g. Auger electrons, and backscattered electrons (BSE).

Further, without limiting the scope, in the following the examples and embodiments of the charged particle beam device are described referring to an SEM. Typically, the devices of embodiments described herein include vacuum-compatible materials. Typical applications of embodiments described herein are for example probing and/or structuring of a specimen in solar wafer manufacturing and in semiconductor device production. In particular, embodiments described herein can be applied for evaluating CD structures of a specimen.

A "specimen" as referred to herein, includes, but is not limited to, semiconductor wafers, semiconductor workpieces, and other workpieces such as memory disks and the like. Embodiments may be applied to any workpiece on which material is deposited, which is inspected or which is structured. A specimen includes a surface to be structured, imaged or on which layers are deposited.

The term "aperture" as used herein is e.g. any kind of an opening through which the charged particle beam passes inside of the charged particle beam device. In some examples of embodiments, the charged particle beam is shaped by the aperture, for instance by blending parts of a divergent charged particle beam bundle. The term "beam aperture", also referred to as beam divergence, as used in embodiments described herein, refers to the angular beam shape of the charged particle beam provided between the objective lens device and the specimen. A beam aperture is indicated herein by a beam aperture angle between the central axis of a beam and an outermost beam ray thereof.

Within the following description of the drawings, the same reference numbers refer to the same components. Generally, only the differences with respect to the individual embodiments are described.

The Apparent Beam Width (ABW) of an electron beam limits the use of a CD SEM to line widths above about 10 nm. One of the factors affecting ABW is the beam divergence or the resulting limited depth of field (DOF).

The capability to locate and e.g. inspect line edges of a CD structure of a specimen is limited by several factors. One factor is the spot size of the incident electron beam, which is determined by: the size of the source image of the primary electron source, i.e. the source size or virtual source size, and optical demagnification; aberrations, primarily axial chromatic and $3^{rd}$ order spherical aberration; and the effect of diffraction. Another limiting factor is the beam aperture, also referred to as beam divergence, a high aspect ratio, e.g. height to width ratio, of the lines to be inspected, and a limited DOF. A further factor affecting the inspection of CD lines is scattering of electrons at and within the specimen. SE and BSE are created within a volume of a certain extent. The volume of the specimen providing information depends e.g. on the energy of the primary electrons and on the material of the line and the specimen to be inspected. Another factor are shape effects, e.g. effects taking into account the shape, which may be imperfect, of the specimen and are therefore not related to the electron optical system.

Figure 1:
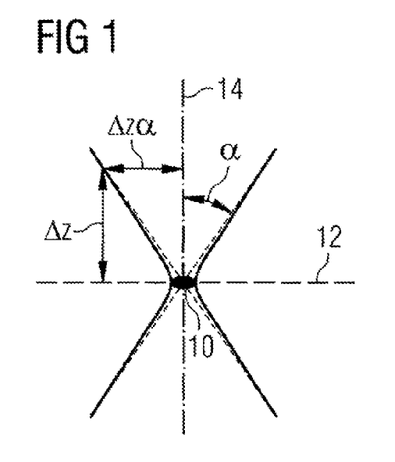
FIG. 1 schematically illustrates the size of a beam spot 10 at its focal plane 12.

All factors limiting the capability of locating and/or inspecting CD structures can be measured by the ABW that can be measured by scanning the primary electron beam across a step like specimen feature. FIG. 1 schematically illustrates the size of a beam spot 10 at its focal plane 12, which is determined by the size of the source image, aberration and diffraction. For planes above or below the focal plane 12, the beam diameter increases due to the divergence of the beam. Therefore, the beam shape can be defined by beam aperture angle $\alpha$ between central axis 14 and a beam ray at the circumference of the beam. If the distance $\Delta z$ from the focal plane is large, the spot diameter can be approximated by $2\Delta z \, \alpha$. For small $\Delta z$ the spot size can be calculated from a weighted rms sum of all contributions to the spot size. For example, in a charged particle beam device including an electron beam source and an SEM column providing an electron beam of normal incidence to the specimen, the spot size can be 2.6 nm for an electron energy of 500 eV. Assuming a line width height of 200 nm, the DOF effect may lead to a Full Width at Half Maximum (FWHM) blur of 3.5 nm, neglecting all other effects on the spot size, such as scattering volume.

Figure 2A:
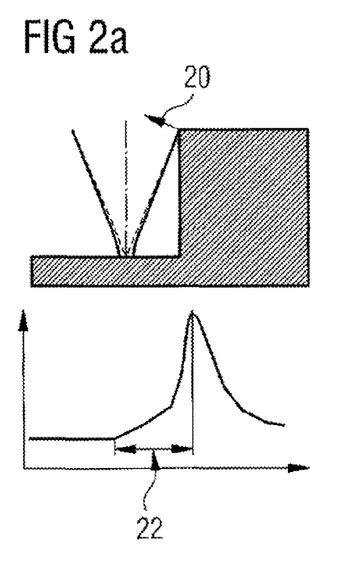
FIGS. 2a and 2b illustrate that the ABW of an SEM can be affected by tilting the primary electron beam.
Figure 2B:
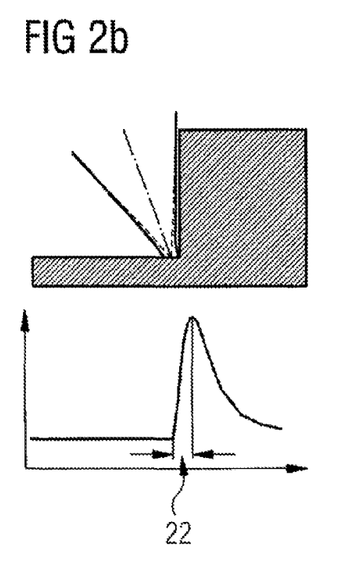

The ABW of an SEM can be affected by tilting the primary electron beam, since blur due to the divergent beam can be reduced by tilting. This is illustrated in FIGS. 2a and 2b, wherein FIG. 2a schematically shows a beam having a normal incidence at the line formed by a step of a specimen and FIG. 2b shows a tilted beam incident to the line. The x axes of FIGS. 2a and 2b indicate the beam position during scanning of the primary electron beam on the specimen. The y axes indicate the SE signal, which is the secondary electron detector signal. For normal incidence, secondary (SE) and backscattered (BSE) electrons 20 will be generated at the step when the spot itself is distant from the edge. As shown in FIG. 2b, if the beam is tilted by at least the aperture angle, this effect can be avoided and the ABW 22 can be reduced. Tilting the beam, however, results in additional aberrations like coma, and a resulting larger spot size, rendering the above mentioned effects of beam tilting worthless or reducing them.

In one embodiment, a charged particle beam device is provided, including: a charged particle beam source adapted to generate a charged particle beam on an axis; an optical aberration correction device and an objective lens device, which define a corrected beam aperture angle adjusted to reduce diffraction; and a charged particle beam tilting device; wherein the optical aberration correction device and the objective lens device are adapted to provide the charged particle beam with a beam aperture angle smaller than the corrected beam aperture angle; and wherein the charged particle beam tilting device is adapted to provide a beam tilt angle or a maximum beam tilt angle, which is equal or less than the corrected beam aperture angle.

According to a further embodiment, a method of operating a charged particle beam device includes: generating a charged particle beam device on an axis; correcting optical aberrations of the charged particle beam; focusing the charged particle beam onto a specimen; and defining a corrected beam aperture angle adjusted to reduce diffraction; wherein the charged particle beam is provided having a beam aperture angle smaller than the corrected beam aperture angle; and the charged particle beam is tilted by a beam tilt angle or a maximum beam tilt angle, which is equal or less than the corrected beam aperture angle.

According to embodiments, which can be combined with any other embodiment described herein, the corrected beam aperture angle is an angle between an outermost beam ray of a corrected and untilted charged particle beam and a central axis of the corrected and untilted charged particle beam. In some embodiments, which can be combined with any other embodiment described herein, the corrected beam aperture angle is an angle between an outermost beam ray of the corrected and untilted charged particle beam and the optical axis of an objective lens device used in the method of embodiments and/or provided in the charged particle beam device of embodiments. In embodiments described herein, the beam is tilted within the corrected beam aperture angle.

In embodiments described herein, the charged particle beam can be tilted with respect to the axis on which the charged particle beam is generated, also called herein axis of symmetry, and/or to the optical axis of the objective lens device. According to embodiments, the axis of symmetry, on which the charged particle beam is generated by the source, is the central axis of the charged particle beam device and may correspond to the optical axis of the objective lens device.

Embodiments described herein allow for improving the ABW by tilting the charged particle beam incident on a specimen. In addition, the tilting of the charged particle beam can be performed fast and without effects like beam shift. A charged particle beam device of embodiments described herein is capable of producing beam spot sizes reduced to about 1 nm. Embodiments described herein are based on choosing a balance between the beam aperture angle and the tilt of the charged particle beam, in order to obtain a reduced beam spot size and to simultaneously remove blur due to beam divergence. Moreover, using embodiments described herein, the tilt of the primary electron beam can be switched on and off or changed very quickly, e.g. using electron optical components like deflectors and/or beam blanking.

A corrected optical SEM system, which has reduced spherical aberration and, in some cases, reduced chromatic aberration, aims at the generation of very small spots of the order of 1 nm. If spherical and/or chromatic aberration of the corrected system is almost zero, diffraction will become the limiting factor for the electron beam spot size. In such a case, diffraction is inversely proportional to the beam aperture angle $\alpha$. Therefore, in order to reduce diffraction, the beam aperture angle has to be increased, resulting in a corrected beam aperture angle $\alpha'$. For instance, in order to obtain a beam spot of 1 nm FWHM and a beam energy of 500 eV, the corrected beam aperture angle $\alpha'$ has to be about 30 mrad. This value is about two or three times the beam aperture angle value of an uncorrected optical SEM system.

Figure 3:
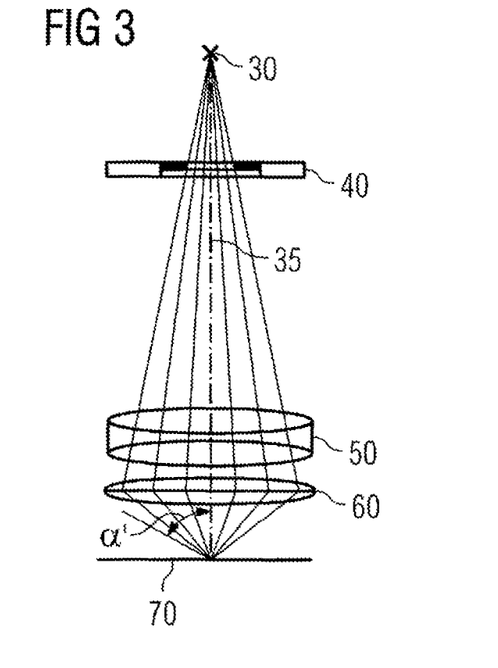
FIG. 3 schematically illustrates a corrected SEM.

FIG. 3 schematically shows an example of a corrected SEM, i.e. an SEM having an optical aberration correction device. The charged particle beam is generated by a source 30 along a central axis 35 of the SEM, directed through an aperture device 40, passes an optical aberration correction device 50, and is focused by objective lens 60 onto the specimen 70. According to the present example, the axis of symmetry, on which the charged particle beam is generated by the source, is the central axis 35 of the charged particle beam device and corresponds to the optical axis of the objective lens device. The corrected SEM provides a corrected beam aperture angle $\alpha'$, which is chosen larger than the beam aperture angle of an uncorrected SEM, in order to reduce diffraction.

Since, in the present example, the corrected beam has a central axis coincident with the optical axis of the objective lens 60, the corrected beam aperture angle $\alpha'$ extends between an outermost beam ray of the corrected beam and the optical axis. Because of the large corrected beam aperture angle, the dominating effect for a CD measurement by a beam spot is due to the beam divergence or due to the reduced DOF. Therefore, for instance, in case of a beam energy of 500 eV and a corrected beam aperture $\alpha'$ of about 30 mrad, the effective spot size (FWHM) for a CD measurement of specimen structures having a height of about 200 nm will be roughly 3.5 nm, instead of 1 nm.

If, in above example of a corrected SEM, a beam bundle having a beam aperture angle smaller than about 30 mrad is used and tilted in such a way that the maximum inclination, e.g. the inclination of an outermost beam ray thereof, with respect to the optical axis of the objective lens, also called herein optical axis of the SEM, is still within 30 mrad, i.e. equal to or less than the corrected beam aperture angle, there will be no coma. For instance, the beam aperture angle $\alpha$ can be chosen to be about 15 mrad and the tilt can be chosen to be about 15 mrad. The FWHM of the spot may then still be limited by diffraction, resulting e.g. in a spot FWHM of about 2 nm for a primary electron beam energy of about 500 eV. Hence, the ABW is improved as compared to the case of an untilted corrected electron beam. In order to measure a CD line of a specimen using this example, the following steps can be performed: step a) of tilting the primary electron beam by 15 mrad counterclockwise to detect the left edge of the line and recording a first SEM image; and step b) of tilting the primary electron beam by 15 mrad clockwise to detect the right edge of the line and recording a second SEM image. In both steps, the tilting is performed with respect to the optical axis of the SEM. Alternatively, step a) can be performed for detecting the left edge of the line and recording a first SEM image, and for detecting the right edge of the line and recording a second SEM image, the tilt of step a) can be maintained and the charged particle beam can be defocused. For instance, the defocusing of the charged particle beam may be performed such that the focal point of the charged particle beam is coincident with the upper border of the right edge.

In embodiments described herein, the tilt of the primary charged particle beam can be induced in different ways: mechanical movement of an aperture through which the primary beam passes; virtual shifting of an aperture through which the primary beam passes by deflectors; and switching between partial beams of the primary charged particle beam, which are generated by passing the primary beam through a multi aperture array. Mechanical movement of an aperture is slow compared to a virtual shifting using deflectors or switching between multiple partial beams.

Figure 4:
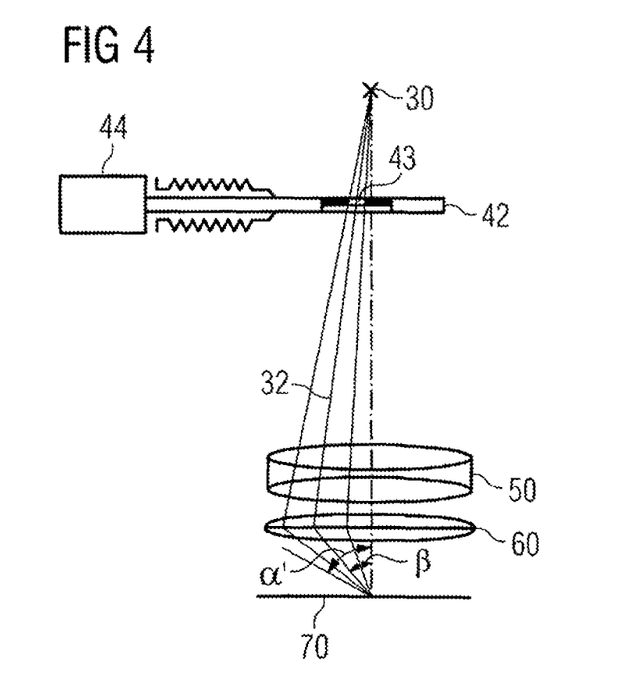
FIG. 4 schematically shows a corrected SEM including a charged particle beam tilting device according to one embodiment.

FIG. 4 schematically shows a corrected SEM including a charged particle beam tilting device, also referred to herein as tilting device, according to one embodiment. Therein, the tilting device includes a movable aperture device 42 having an x,y-manipulator 44 and positioned on the central axis 35 between the source 30 and the correction device 50. Thereby, aperture 43 of the aperture device 42 can be moved perpendicularly to the central axis 35, in order to direct the charged particle beam into a region distant from the central axis. Alternatively or in addition, the diameter of the aperture 43 can be reduced to blend a part of the charged particle beam. As shown in FIG. 4, for instance a beam bundle between the circumference of the primary charged particle beam and the central axis 35 can pass the aperture 43. Since the resulting charged particle beam passes the correcting device 50 and the objective lens 60, it is tilted within the corrected beam aperture angle α'. For instance, as shown in FIG. 4, a ray 32 of the charged particle beam incident on the specimen 70 is provided with a beam tilt angle β less than the corrected beam aperture angle α'. The whole charged particle beam incident on the specimen 70 is provided with a beam tilt angle less than the corrected beam aperture angle α', without adding coma aberration and a corresponding increase of the spot size.

According to embodiments, the tilting device can include one or more circular apertures, one or more semi-circular apertures or one or more apertures of other shapes. For instance, the aperture device 42 may have a semi-circular aperture, of which the circular part is positioned facing outer beam rays of the initial charged particle beam. Thereby, a good resolution perpendicular to the line structure on the specimen and an even better resolution in parallel to the line structure on the specimen can be achieved. Moreover, a higher charged particle current and a significantly optimized throughput of the charged particles may be obtained.

Figure 5:
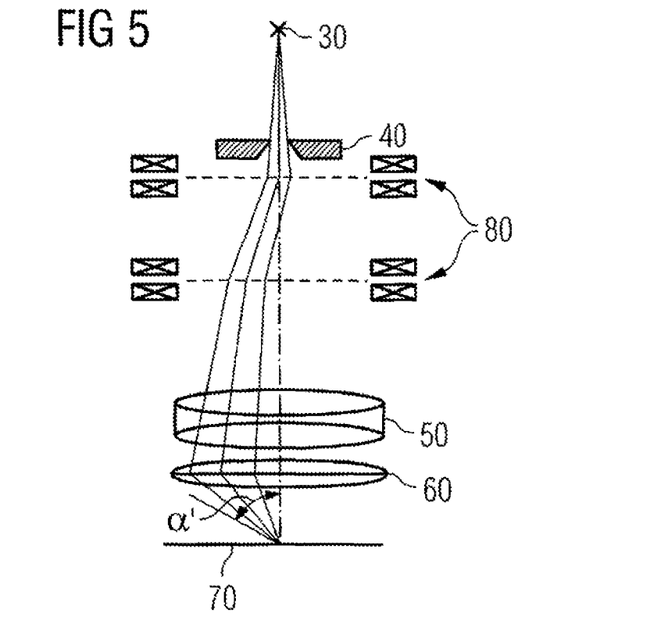
FIG. 5 schematically shows a corrected SEM including a charged particle beam tilting device according to another embodiment.

FIG. 5 schematically shows a corrected SEM including a charged particle beam tilting device according to another embodiment. Therein, the tilting device includes a double stage deflector device 80 having its pivot point at the source 30. The deflector device 80 encompasses the central axis 35 and is positioned between the source 30 and the correction device 50. Thereby, as shown in FIG. 5, the primary charged particle beam passing the aperture 40 can be deflected into a region distant from the central axis 35. As shown in FIG. 5, the resulting charged particle beam passes the correcting device 50 and the objective lens 60 and is tilted within the corrected beam aperture angle α'. That means, the charged particle beam incident on the specimen 70 is provided with a beam tilt angle less than the corrected beam aperture angle α', without adding coma aberration and a corresponding increase of the spot size.

Figure 6:
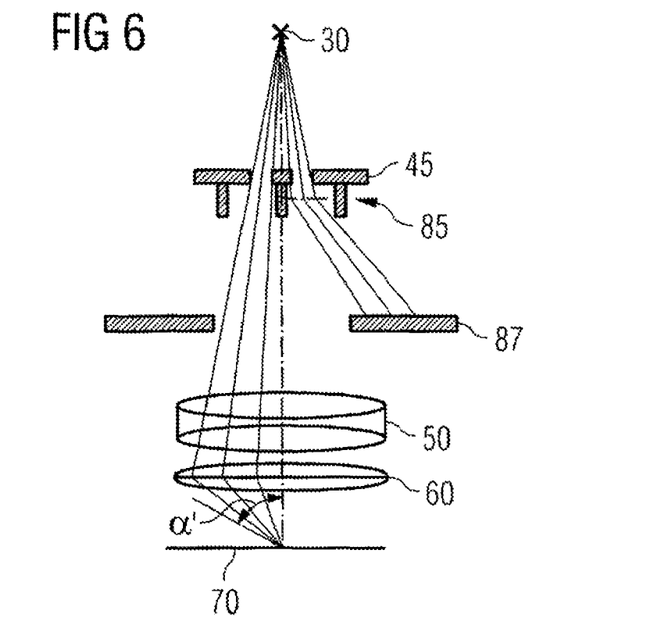
FIG. 6 schematically shows a corrected SEM including a charged particle beam tilting device according to a further embodiment.

FIG. 6 schematically shows a corrected SEM including a charged particle beam tilting device according to a further embodiment. Therein, the tilting device includes a multi aperture array 45, a deflector array 85 and a beam stop 87. The tilting device is positioned between the source 30 and the correction device 50. The primary charged particle beam is divided by the multi aperture array 45 into multiple partial beam bundles. As shown in FIG. 6, according to one example of the present embodiment, one of the partial beam bundles in a region between the circumference of the primary charged particle beam and the central axis is not affected by the deflector device and passes the deflector array, the correcting device 50 and the objective lens 60 and is tilted within the corrected beam aperture angle α'. Other partial beam bundles are deflected onto the beam stop 87 and thereby blended. As shown in FIG. 6, the resulting partial charged particle beam incident on the specimen 70 is provided with a beam tilt angle less than the corrected beam aperture angle α', without adding coma aberration and a corresponding increase of the spot size.

According to embodiments described herein, the primary beam spot produced at the specimen does not move during the tilting of the primary beam. This is due to the corrected optics, creating for the tilted primary beam an image of the source at the specimen at exactly the same position as for an untilted beam, as long as the bundle of beam rays used for imaging is confined to the corrected beam aperture angle range. Limitations due to the precision of machining of the charged particle beam device, alignment of components of the charged particle beam device and parasitic high order multipole fields, for instance resulting from deflectors used e.g. for alignment, can be neglected.

Figure 7:
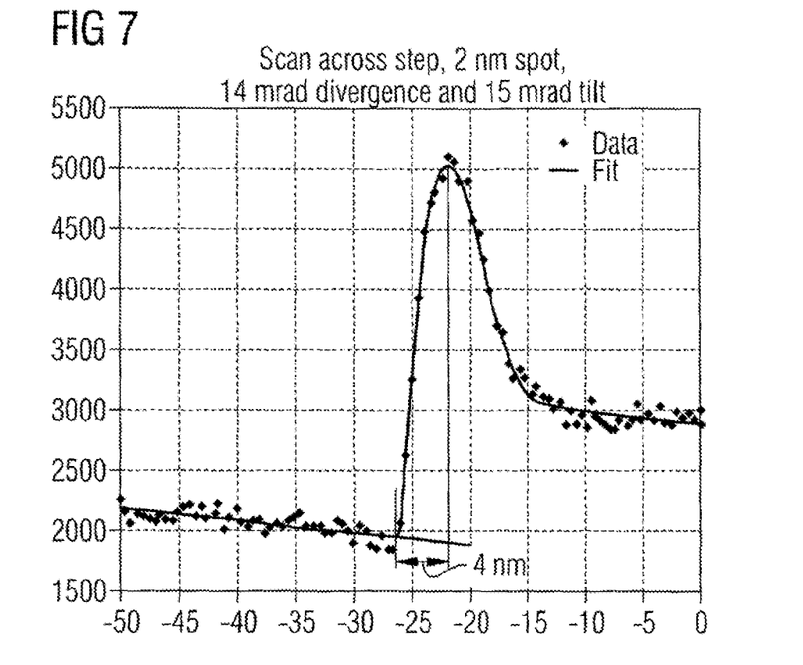
FIGS. 7 to 9 show the effects of embodiments, using a Monte Carlo Simulation.
Figure 8:
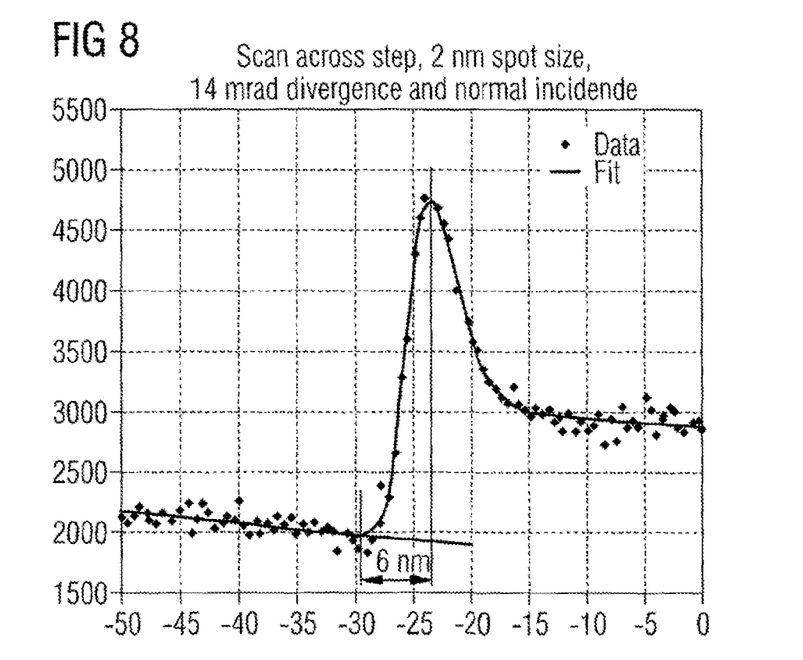
Figure 9:
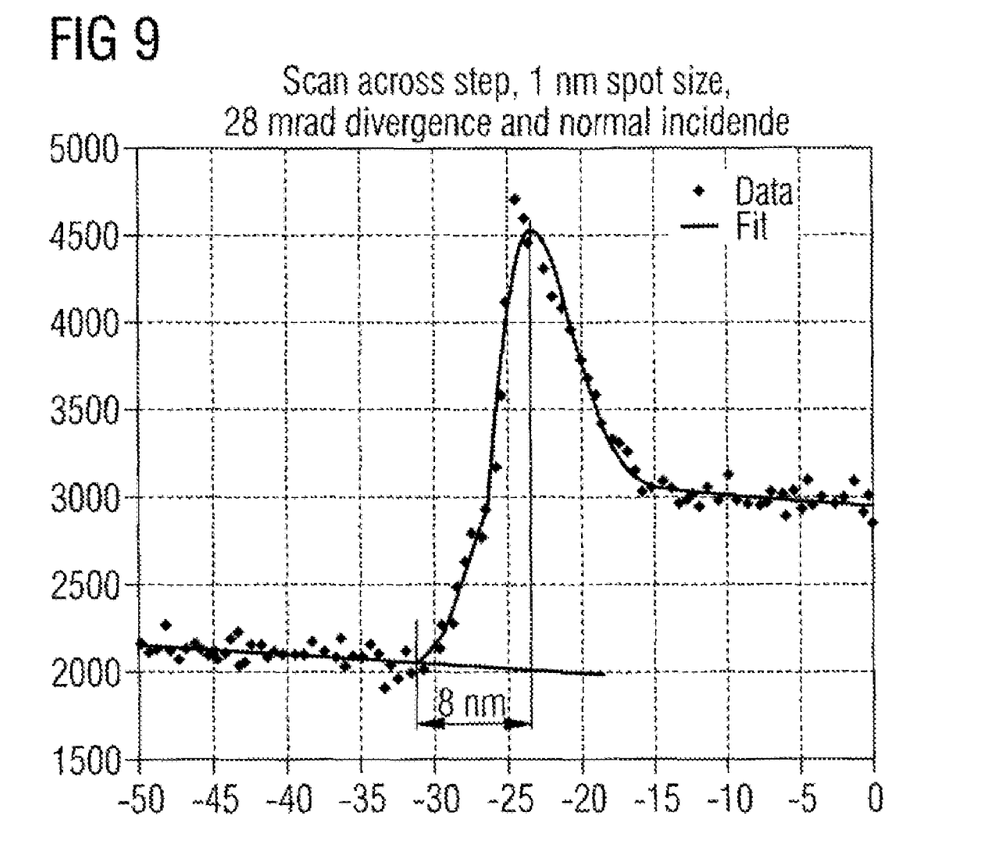

FIGS. 7 to 9 show the effects of above embodiments on the ABW of an SEM, using a Monte Carlo Simulation. The parameters indicated by x axes and y axes of the graphs shown in FIGS. 7 to 9 are scan position/nm for the x axes and SE signal for the y axes. FIG. 7 illustrates an SEM signal for a step of 200 nm height and made of silicon using a beam of 2 nm spot size, 1 mrad beam aperture angle, also called divergence, and 15 mrad beam tilt in a method according to embodiments described herein. As can be seen therefrom, the signal rises from background level to the maximum value over a distance of 4 nm. Aside the spot size and beam divergence, the signal also includes the blur due to scattering. FIG. 8 illustrates a simulation made for the system used for FIG. 7, but calculated with normal incidence. As evident from FIG. 8, the width of the curve increases to approximately 6 nm. FIG. 9 shows a signal simulated for a step of 200 nm height and made of silicon using a beam of 1 nm spot and 28 mrad beam aperture angle at normal incidence. The small spot of FIG. 9 usually gives high resolution for "flat" samples, but as apparent from the simulation, due to the large beam aperture angle, resolution is poor for the step. Consequently, FIGS. 7 to 9 clearly show that, using embodiments described herein, the beam width can be reduced when the beam is tilted slightly and is significantly better than for a system creating a small spot size using a large beam aperture angle.

According to embodiments described herein, the optical aberration correction device is adapted to adjust and/or reduce the optical aberration. In the method of embodiments, during the step of correcting the optical aberration, the optical aberration can be adjusted and/or reduced. For instance, embodiments described herein do not require a charged particle beam device corrected to totally prevent optical aberrations, such as chromatic and spherical aberration, as long as the effect of additional aberrations induced by tilting the charged particle beam is smaller than the blur resulting from the divergent beam having the large corrected beam aperture angle and normal incidence to the specimen. For example, according to embodiments described herein, the optical aberration correction device allows not only a spherical aberration coefficient $C_S=0$, but to adjust $C_S$ within some range above $C_S=0$. This may be due to the effect that, even if $C_S$ is not exactly zero, for some values of $C_S$, the ABW is smaller for a tilted charged particle beam with a reduced beam aperture angle than for a charged particle beam which has normal incidence to the specimen and a large corrected beam aperture angle.

According to one embodiment, a charged particle beam device is provided, including: a charged particle beam source adapted to generate a charged particle beam on an axis; an optical aberration correction device and an objective lens device, which define a corrected beam aperture angle adjusted to reduce diffraction; and a charged particle beam tilting device; wherein the optical aberration correction device and the objective lens device are adapted to provide the charged particle beam with a beam aperture angle smaller than the corrected beam aperture angle; and wherein the charged particle beam tilting device is adapted to provide a beam tilt angle which is equal or less than the corrected beam aperture angle.

In one embodiment, which can be combined with any other embodiment described herein, the optical aberration correction device is adapted to adjust and/or reduce the optical aberration.

In one embodiment, which can be combined with any other embodiment described herein, the charged particle beam tilting device includes at least one element chosen from: a movable aperture; a movable aperture positioned on the axis; a multi aperture array; a multi aperture array positioned on the axis; one or more charged particle beam deflector devices;

and a double stage charged particle beam deflector device having a pivot point at the source.

In one embodiment, which can be combined with any other embodiment described herein, the corrected beam aperture angle ($\alpha'$) is in a range of about 217 mrad, e.g. for 10 eV final beam energy, to about 10 mrad, e.g. for 5 keV final beam energy; and/or the final beam energy is in a range of about 10 eV to several 10 keV, preferably about 10 eV to about 5 keV In one embodiment, which can be combined with any other embodiment described herein, the axis is a central axis of the charged particle beam device.

According to another embodiment, a method of operating a charged particle beam device includes: generating a charged particle beam device on an axis; correcting optical aberrations of the charged particle beam; focusing the charged particle beam onto a specimen; and defining a corrected beam aperture angle adjusted to reduce diffraction; wherein the charged particle beam is provided having a beam aperture angle smaller than the corrected beam aperture angle; and the charged particle beam is tilted by a beam tilt angle which is equal or less than the corrected beam aperture angle.

In one embodiment, which can be combined with any other embodiment described herein, adjusting and/or reducing the optical aberration during the step of correcting.

In one embodiment, which can be combined with any other embodiment described herein, the charged particle beam device is tilted by at least one step selected from: moving an aperture; moving an aperture positioned on the axis; directing the charged particle beam through a multi aperture array; directing the charged particle beam through a multi aperture array positioned on the axis; producing multiple partial charged particle beams having different tilt angles from the charged particle beam and blanking one or more of the partial charged particle beams; deflecting the charged particle beam and/or one or more multiple charged particle beams produced from the charged particle beam; deflecting the charged particle beam by a double stage charged particle beam deflector device having a pivot point at a source of the charged particle beam.

In one embodiment, which can be combined with any other embodiment described herein, the corrected beam aperture angle is in a range of 217 mrad to 10 mrad; and/or the final beam energy is in a range of 10 eV to 5 keV.

In one embodiment, which can be combined with any other embodiment described herein, the charged particles are chosen from electrons and ions.

One embodiment, which can be combined with any other embodiment described herein, includes in the step of tilting the charged particle beam a) tilting the charged particle beam clockwise to detect a first edge of a CD structure of the specimen and recording a first image; and/or b) tilting the charged particle beam counterclockwise to detect a second edge of the CD structure and recording a second image. In a variation of this embodiment, step a) is performed and for detecting the second edge of the CD structure and recording the second image, the charged particle beam is defocused.

In one embodiment of a method, which can be combined with any other embodiment described herein, the charged particle beam device is a device according to any of above embodiments.

According to a further embodiment, a charged particle beam device according to above one embodiment is used in a method of probing and/or structuring of a specimen.

According to a yet further embodiment, a charged particle beam device according to above one embodiment is used in a method of measuring a CD of a specimen.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the embodiments described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A method of operating a charged particle beam device for measuring a critical dimension of a specimen, comprising:
   generating a charged particle beam on an axis;
   correcting spherical aberrations of the charged particle beam allowing for increasing the beam aperture angle to a larger beam aperture angle;
   focusing the charged particle beam onto a specimen; and
   defining a corrected beam aperture angle adjusted to reduce diffraction;
     wherein the corrected beam aperture angle is the larger beam aperture angle;
     wherein the charged particle beam is provided having a beam aperture angle smaller than the corrected beam aperture angle; and
   the charged particle beam is tilted by a beam tilt angle which is equal to or less than the corrected beam aperture angle such that the beam is tilted having an outermost ray within the corrected beam aperture angle.

2. The method of claim 1, comprising:
   adjusting the optical aberration during the step of correcting.

3. The method of claim 1, comprising:
   reducing the optical aberration during the step of correcting.

4. The method of claim 1, wherein the charged particle beam device is tilted by at least one step selected from:
   moving an aperture;
   moving an aperture positioned on the axis;
   directing the charged particle beam through a multi aperture array;
   directing the charged particle beam through a multi aperture array positioned on the axis;
   producing multiple partially charged particle beams having different tilt angles from the charged particle beam and blanking one or more of the partially charged particle beams;
   deflecting the charged particle beam and/or one or more multiple charged particle beams produced from the charged particle beam; and
   deflecting the charged particle beam by a double stage charged particle beam deflector device having a pivot point at a source of the charged particle beam.

5. The method of claim 2, wherein the charged particle beam device is tilted by at least one step selected from:
   moving an aperture;
   moving an aperture positioned on the axis;
   directing the charged particle beam through a multi aperture array;

directing the charged particle beam through a multi aperture array positioned on the axis;

producing multiple partially charged particle beams having different tilt angles from the charged particle beam and blanking one or more of the partially charged particle beams;

deflecting the charged particle beam and/or one or more multiple charged particle beams produced from the charged particle beam; and deflecting the charged particle beam by a double stage charged particle beam deflector device having a pivot point at a source of the charged particle beam.

6. The method of claim 1, wherein
the corrected beam aperture angle is in a range of 217 mrad to 10 mrad.

7. The method of claim 1, wherein
the final beam energy is in a range of 10 eV to 5 keV.

8. The method of claim 7, wherein
the final beam energy is in a range of 10 eV to 5 keV.

9. The method of claim 1, wherein the charged particles are chosen from electrons and ions.

10. The method of claim 1, comprising in the step of tilting the charged particle beam
   a) tilting the charged particle beam clockwise or counter-clockwise to detect a first edge of a CD structure of the specimen and recording a first image.

11. The method of claim 10, comprising in the step of tilting the charged particle beam
   b) tilting the charged particle beam oppositely to step a) to detect a second edge of the CD structure and recording a second image.

12. The method of claim 10, wherein step a) is performed and for detecting the second edge of the CD structure and recording the second image, the charged particle beam is defocused.

13. The method of claim 1, wherein the charged particle beam device comprises:
   a charged particle beam source adapted to generate a charged particle beam on an axis;
   an optical aberration correction device and an objective lens device, which define a corrected beam aperture angle adjusted to reduce diffraction; and
   a charged particle beam tilting device wherein
   the optical aberration correction device and the objective lens device are adapted to provide the charged particle beam with a beam aperture angle smaller than the corrected beam aperture angle; and
   the charged particle beam tilting device is adapted to provide a beam tilt angle which is equal to or less than the corrected beam aperture angle.

14. The method of claim 1, wherein the charged particle beam device is used for probing a specimen and for measuring a CD of a specimen.

15. The method of claim 1, wherein the charged particle beam device is used for structuring a specimen and for measuring a CD of a specimen.

16. The method of claim 14, wherein the charged particle beam device is used for probing a specimen and for measuring a CD of a specimen.

* * * * *

UNITED STATES PATENT AND TRADEMARK OFFICE
CERTIFICATE OF CORRECTION

PATENT NO. : 8,294,096 B2
APPLICATION NO. : 13/089059
DATED : October 23, 2012
INVENTOR(S) : Banzhof It is certified that error appears in the above-identified patent and that said Letters Patent is hereby corrected as shown below:

In the Claims:

Column 11, Claim 8, Line 18, please delete "7" and insert --6-- therefor;

Column 12, Claim 16, Line 26, please delete "14" and insert --13-- therefor.

Signed and Sealed this
Twelfth Day of March, 2013

Teresa Stanek Rea
*Acting Director of the United States Patent and Trademark Office*